Aug. 2, 1966 J. M. GAULT 3,264,492

ADJUSTABLE SEMICONDUCTOR PUNCH-THROUGH DEVICE HAVING THREE JUNCTIONS

Filed Aug. 6, 1963

INVENTOR.
JOHN M. GAULT

BY

OSTROLENK, FABER, GERB & SOFFEN

ATTORNEYS

United States Patent Office 3,264,492

Patented August 2, 1966

3,264,492

ADJUSTABLE SEMICONDUCTOR PUNCH-THROUGH DEVICE HAVING THREE JUNCTIONS

John M. Gault, Manhattan Beach, Calif., assignor to International Rectifier Corporation, El Segundo, Calif., a corporation of California Filed Aug. 6, 1963, Ser. No. 300,206
2 Claims. (Cl. 307—88.5)

This invention relates to a novel field effect transistor, and more specifically relates to a field effect transistor having the characteristics of a controlled current limited Zener diode.

More specifically, and in accordance with the invention, opposing N type and P type conductivity regions which join at a junction have embedded therein respective P and N junctions which are spaced from the main junction.

A reverse bias is then applied to the junction formed between one of the inner P or N areas and the region in which it is embedded so that the space charge region width is determined by the reverse bias. When this space charge region is sufficiently large to intersect the major junction between N and P areas, a "punch-through" will occur so that a large current may flow through the major load circuit. In this regard, the device may exhibit electrical characteristics similar to a Zener diode. The point at which large electrical currents begin to flow will be determined by the voltage at which "punch-through" occurs rather than avalanche or Zener breakdown of the junction in question.

However, a controllable reverse bias is applied between the other of the embedded regions and its respective main region which results in the formation of a second space charge region through which load current must flow. The magnitude of the control bias will, therefore, control the saturation current level of main current flow after punch-through is achieved.

Accordingly, a primary object of this invention is to provide a novel field effect transistor.

Another object of this invention is to provide a novel field effect transistor which operates as a current limited Zener diode.

Still another object of this invention is to provide a novel semiconductor structure for a field effect transistor in which the saturation curve of the device can be adjusted by its geometry.

Still another object of this invention is to provide a novel field effect transistor which has an adjustable saturation current.

These and other objects of this invention will become apparent from the following description when taken in connection with the drawings, in which.

Figure 1:
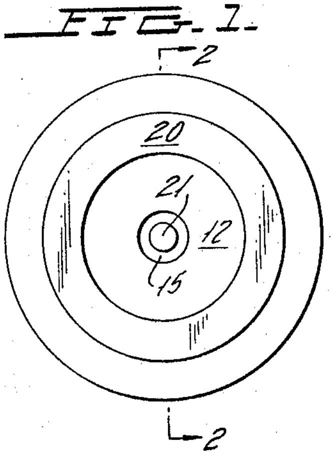
FIGURE 1 is a plan view of a field effect transistor manufactured in accordance with the invention.
Figure 2:
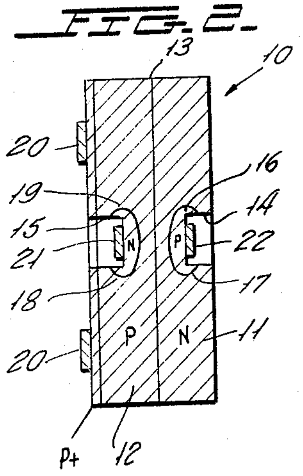
FIGURE 2 is a cross-sectional view of FIGURE 1 taken across the lines 2—2 in FIGURE 1.
Figure 3:
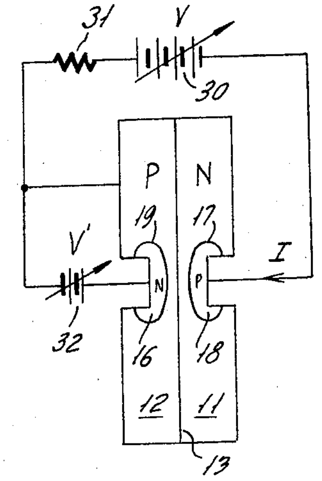

FIGURE 3 schematically illustrates the device of FIGURES 1 and 2 along with the control circuitry therefor.

Figure 4:
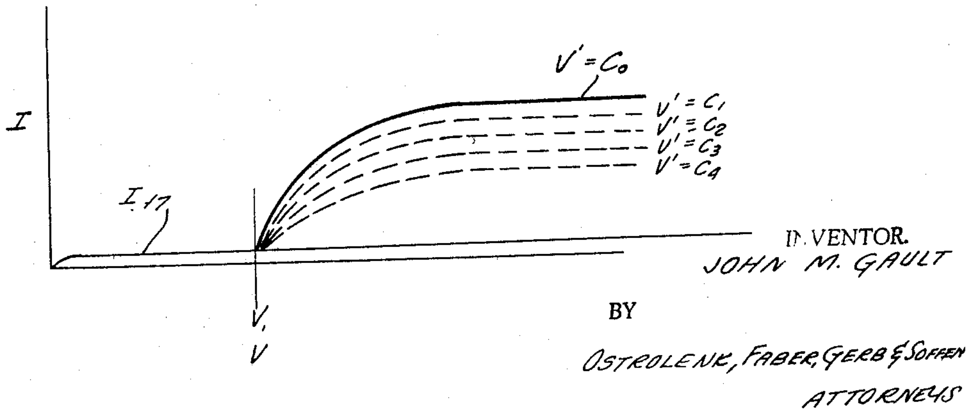

FIGURE 4 schematically illustrates load current as a function of reverse bias voltage for various levels of control bias.

Referring first to FIGURES 1 and 2, I have illustrated therein a field effect transistor-type device which is comprised of a circular wafer 10 which may be of silicon or any other appropriate semiconductor material which has a first N type region 11 and a first P type region 12 which join one another along the junction 13. Two openings 14 and 15 are formed in either side of wafer 10. A P type conductivity zone 16 is formed in N region 11 at the base of opening 14 to form a P-N junction 17 in the region 11.

An N type region 18 is then formed in the P type region 12 at the base of opening 15 to form a further junction 19.

The surface of P type region 12 may then be rendered of the P+ conductivity type, and an electrode 20 is then appropriately formed on region 12. In addition, appropriate electrode means 21 and 22 may be provided for regions 18 and 16 respectively, care being taken not to have electrodes 21 or 22 in contact with regions 12 or 11 respectively.

The dimensions of a typical device of the type shown in FIGURES 1 and 2 could, for example, be as follows, it being clearly understood that these examples are solely for illustrative purposes:

The wafer height could, for example, be from 0.050 to 0.100 inch. The wafer thickness could, for example, be 0.010 inch, with the junction 13 bisecting the wafer thickness. Openings 14 and 15 may have a diameter of 0.010 inch, and a depth of the order of 0.0025 inch. Regions 16 and 18 may then have a depth of the order of .002 inch and .002 inch, respectively, and diameters of the order of .014 inch.

More generally, however, the maximum spacing between junction 18 and junction 13 to obtain the well known punch-through effect will be determined by Poissons equation:

$$W_{max} \leq \sqrt{V_p 2 \epsilon \rho \mu}$$

FIGURE 3 illustrates one typical manner in which the device of FIGURES 1 and 2 may be connected in an electrical circuit. Thus, the main load circuit is comprised of a reverse bias voltage source 30 having an output voltage V which is connected in series with region 18, N region 11, P region 12, and appropriate load circuit means 31.

A source 32 of control voltage V′ is then connected from the N type region 16 through the P type region 12 to place a reverse bias on the junction 19.

In operation, the voltage source 30 will reverse bias the P-N junction 17 causing an increase in the width of the space charge region surrounding junction 17 with only the junction leakage current $I_{17}$ flowing, as indicated in FIGURE 4. When the voltage of source 30 reaches a suitable value $V_1$ of FIGURE 4, the space charge region expanding from junction 17 will have intersected the P-N junction 13 to cause a "punch-through," as is well known for the typical transistor-type punch-through effect. A large current I may then flow through the circuit until it reaches a saturation current, as indicated by the solid line in FIGURE 4.

The current flowing through the P region 12 to the external circuit will result in a voltage drop in the material surrounding junction 19 which induces a reverse bias on junction 19. The reverse bias on junction 19 results in a broadening of the space charge region which has a width determined by the voltage drop in region 12 due to the flow of current and the magnitude of the voltage V′ applied from source 32. Thus, the effective reverse bias on junction 19 is increased by the flow of current I to result in a further broadening of the space charge region. When this space charge region becomes broad enough it will begin to intersect the punch-through region of junction 13. Therefore, a saturation effect sets in, as illustrated in FIGURE 4 where it is presumed that the voltage V′ is held to some constant value $C_0$. This current is then held relatively constant until the voltage V reaches a value which causes avalanche breakdown of junction 17 or 19, whereupon the current rises in an unlimited manner.

In order to control saturation current level, the voltage V′ may be adjusted to any desired constant voltage such as constant voltage levels $C_1$ through $C_4$ of FIGURE 4 which results in saturation curves indicated in dotted lines. That is to say, the dotted lines of FIGURE 4 illustrate the effect of the external bias voltage V′ on junction 19 wherein the greater the bias value, the lower will be the devices saturation current.

It is also possible, by appropriate control of the geometry of the device, to arrange junction 19 so that the space charge region expanding therefrom will intersect junction 13 at a predetermined point to result in a decrease in the punch-through current flowing through junction 17.

The actual values of the curve of FIGURE 4 will, of course, be a function of the geometry and resistivity of the various sections of the device of FIGURES 1 and 2. For example, punch-through voltage may be decreased by bringing junctions 17 and 13 closer together, or by increasing the resistivity of the N type region 11. Similarly, the saturation current of the device can be increased by moving junctions 13 and 19 further apart, or by reducing the resistivity of the P type region 12.

The manner in which the device of FIGURES 1 and 2 may be manufactured can be selected from any of various well-known techniques. By way of example, epitaxial deposition techniques may be utilized, or the like.

In a typical method of manufacture, a wafer of appropriate resistivity is first formed of N type material of appropriate resistivity. Thereafter, the P type region 12 may be diffused into one surface of the wafer to form the junction 13. Next, openings 14 and 15 are formed in the opposing wafer surfaces as by controlled etching or sandblasting techniques, or the like. Thereafter, all exposed surfaces except the base of openings 14 and 15 are masked, and the N type region 18 is formed in any desired manner as by an alloying technique. Next, P type region 16 is also formed in any desired manner as by alloying. Finally, the electrodes 20, 21 and 22 are secured to the device in any desired manner.

Although I have described my invention with respect to its preferred embodiments, it should be understood that many variations and modifications will not be obvious to those skilled in the art, and I prefer therefore to be limited not by the specific disclosure herein, but only by the appended claims.

The embodiments of the invention in which an exclusive privilege or property is claimed are defined as follows:

1. A monocrystalline device comprising a body of semiconductive material having two opposed major surfaces, a first region of one conductivity type extending to one of said surfaces and a second region of opposite conductivity type extending to the other of said surfaces, said first and second regions defining a first intermediate p-n junction which is substantially parallel to said surfaces, a coaxial opening in each of said surfaces, a third region forming a second p-n junction with said first region and a fourth region forming a third junction with said second region, each of said third and fourth regions extending from adjacent the bottom of one of said openings, an electrode at the bottom of each of said openings forming first and second electrodes on each of said third and fourth regions respectively, and an annular electrode on one of said surfaces forming an ohmic connection to said first region and being concentrically disposed about one of said openings, and the maximum thickness of the thinnest part of the second region between being defined by $W_{max}=\sqrt{V_p 2\epsilon\rho\mu}$ wherein $V_p$, $\epsilon$, $\rho$, and $\mu$ are respectively the punch-through voltage, dielectric constant, resistivity, and mobility of the conducting current carriers of the thinnest part.

2. An electrical system comprising the device of claim 1 and further including an adjustable voltage source means connected across said annular electrode and said second electrode for reverse biasing said third junction and adjustable to create a depletion region in said second region which extends to the first intermediate junction, and second adjustable biasing means connected across said annular electrode and said first electrode, said second means reverse biasing said first junction and creating a depletion region within said first region which determines the saturation current flowing between said annular electrode and said second electrode.

References Cited by the Examiner

UNITED STATES PATENTS

| | | | |
|---|---|---|---|
| 2,843,515 | 7/1958 | Statz et al. | 317—235 X |
| 2,905,836 | 9/1959 | Herold | 307—88.5 |
| 2,927,222 | 3/1960 | Turner | 307—88.5 |
| 2,975,342 | 3/1961 | Rediker | 307—88.5 |
| 3,162,770 | 12/1964 | Rutz | 307—88.5 |

FOREIGN PATENTS

| | | |
|---|---|---|
| 753,133 | 7/1956 | Great Britain. |

JAMES D. KALLAM, *Acting Primary Examiner.*

JOHN W. HUCKERT, *Examiner.*

A. M. LESNIAK, *Assistant Examiner.*